US007362103B2

(12) United States Patent
Ger et al.

(10) Patent No.: US 7,362,103 B2
(45) Date of Patent: Apr. 22, 2008

(54) SYSTEM FOR DRIVING A PLURALITY OF LAMPS AND FAULT DETECTING CIRCUIT THEREOF

(75) Inventors: Chih-Chan Ger, Shenzhen (CN); Chia-Kun Chen, Shenzhen (CN); Chi-Wen Kan, Shenzhen (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,745

(22) Filed: Apr. 28, 2006

(65) Prior Publication Data

US 2007/0115001 A1 May 24, 2007

(30) Foreign Application Priority Data

Nov. 18, 2005 (TW) ................................ 094140646

(51) Int. Cl.
*G01R 31/00* (2006.01)
*G01R 33/02* (2006.01)

(52) U.S. Cl. ....................................... 324/414; 324/529

(58) Field of Classification Search ................ 324/414, 324/529

See application file for complete search history.

(56) References Cited

U.S. PATENT DOCUMENTS

| | | | | |
|---|---|---|---|---|
| 3,676,738 | A * | 7/1972 | Scanlan | 361/49 |
| 5,446,392 | A * | 8/1995 | Inoue et al. | 324/678 |
| 5,986,860 | A * | 11/1999 | Scott | 361/42 |
| 6,069,448 | A | 5/2000 | Yeh | |
| 6,111,732 | A * | 8/2000 | Beland | 361/42 |
| 6,188,553 | B1 * | 2/2001 | Moisin | 361/52 |
| 6,473,722 | B1 * | 10/2002 | Nakano | 702/185 |
| 6,856,096 | B1 * | 2/2005 | Choudhury | 315/119 |

* cited by examiner

*Primary Examiner*—Andrew H. Hirshfeld
*Assistant Examiner*—John Zhu
(74) *Attorney, Agent, or Firm*—Wei Te Chung

(57) ABSTRACT

A system for driving a plurality of lamps includes an inverter circuit (20) and a fault detecting circuit (30). The inverter circuit includes a plurality of outputs divided into a first output part and a second output part. The fault detecting circuit is used for detecting whether one or more of the plurality of outputs of the inverter circuit is faulty, and includes a magnetic element circuit (300) and a signal detecting circuit (310). The magnetic element circuit is used for generating an induction signal according to flux changes of the magnetic element circuit when one of the plurality of outputs is faulty. The signal detecting circuit is used for generating a fault signal according to the induction signal.

14 Claims, 3 Drawing Sheets

SYSTEM FOR DRIVING A PLURALITY OF LAMPS AND FAULT DETECTING CIRCUIT THEREOF

FIELD OF THE INVENTION

The invention relates to systems for driving a plurality of lamps, and particularly to a system for driving a plurality of lamps used in backlight modules of liquid crystal displays.

DESCRIPTION OF RELATED ART

Discharge Lamps, especially Cold Cathode Fluorescent Lamps (CCFLs), are used as light sources for liquid crystal display (LCD) panels. Typically, the CCFLs are driven by a plurality of inverter circuits. An inverter circuit provides alternating current (AC) signals to the CCFLs.

For larger LCD panels, two or more CCFLs are typically required to provide sufficient luminance. Therefore, the inverter circuit employed by the large LCD panels includes a plurality of outputs, for providing sufficient AC signals to the CCFLs. However, when one of a plurality of outputs of the inverter circuit is faulty, such as no output or short circuit, a corresponding CCFL doesn't work so that symmetrical luminance is not provided to the LCD panel. The above-mentioned inverter circuits also do not detect whether any of the plurality of outputs is faulty, and therefore do not provide protection functions.

SUMMARY OF THE INVENTION

One embodiment of the invention provides a system for driving a plurality of lamps. The system includes an inverter circuit and a fault detecting circuit. The inverter circuit includes a plurality of outputs divided into a first output part and a second output part. The fault detecting circuit is used for detecting whether one or more of the plurality of outputs is faulty, and includes a magnetic element circuit and a signal detecting circuit. The magnetic element circuit is used for generating an induction signal according to flux changes of the magnetic element circuit when one of the plurality of outputs is faulty, and the signal detecting circuit is used for generating a fault signal according to the induction signal.

Another embodiment of the invention provides a fault detecting circuit for utilization in an inverter circuit including a plurality of outputs, and for detecting whether any of the plurality of outputs of the inverter circuit is faulty. The plurality of outputs is divided into a first output part and a second output part. The fault detecting circuit includes a magnetic element circuit and a signal detecting circuit. The magnetic element circuit is used for generating an induction signal according to flux changes of the magnetic element circuit when one of a plurality of outputs is faulty, and the signal detecting circuit is used for generating a fault signal according to the induction signal.

Other advantages and novel features will become more apparent from the following detailed description when taken in conjunction with the accompanying drawings, in which:

DETAILED DESCRIPTION OF THE INVENTION

Figure 1:
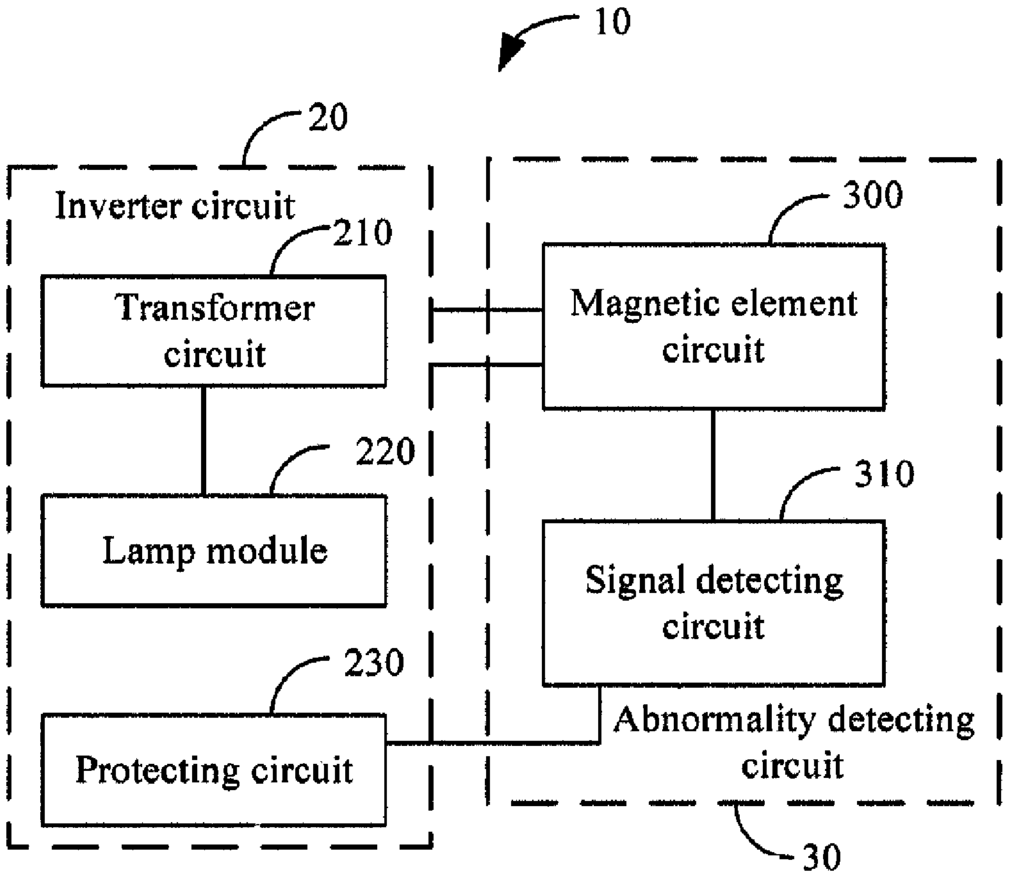
FIG. 1 shows a block diagram of a system for driving a plurality of lamps in accordance with a preferred embodiment of the invention, the system for driving a plurality of lamps including a fault detecting circuit.

FIG. 1 is a block diagram of a system 10 for driving a plurality of lamps in accordance with a preferred embodiment of the invention. In this preferred embodiment, the system 10 includes an inverter circuit 20 and a fault detecting circuit 30. The inverter circuit 20 includes a plurality of outputs, which are divided into a first output part and a second output part. The fault detecting circuit 30 is connected to the inverter circuit 20, and is used for detecting whether one or more of the plurality of outputs of the inverter circuit 20 is faulty. In this preferred embodiment, the plurality of outputs are divided to prevent the fault detecting circuit 30 from mistakenly identifying an output as faulty.

The inverter circuit 20 includes a transformer circuit 210, a lamp module 220, and a protecting circuit 230. The transformer circuit 210 is used for sending alternating current (AC) signals to the lamp module 220. In another preferred embodiment, the inverter circuit may not include the lamp module 220. When the fault detecting circuit 30 detects that one or more of the plurality of outputs of the inverter circuit 20 is faulty, the protecting circuit 230 protects the inverter circuit 20. The protecting circuit 230 can be designed according to different demands of customers.

In this preferred embodiment, the fault detecting circuit 30 is connected to the transformer circuit 210, and the AC signals output by the transformer circuit 210 are the outputs of the inverter circuit 20. In alternative embodiments of the invention, the fault detecting circuit 30 is connected to the lamp module 220 of the inverter circuit 20, and the AC signals output by the lamp module 220 are the outputs of the inverter circuit 20.

The fault detecting circuit 30 includes a magnetic element circuit 300 and a signal detecting circuit 310. The magnetic element circuit 300 is connected to the inverter circuit 20. When one or more of the plurality of outputs of the inverter circuit 20 is faulty, flux in the magnetic element circuit 300 changes, and the magnetic element circuit 300 generates an induction signal based on the changed flux. The signal detecting circuit 310 is used for generating a fault signal according to the induction signal generated by the magnetic element circuit 300, and for sending the fault signal to the protecting circuit 230.

Figure 2:
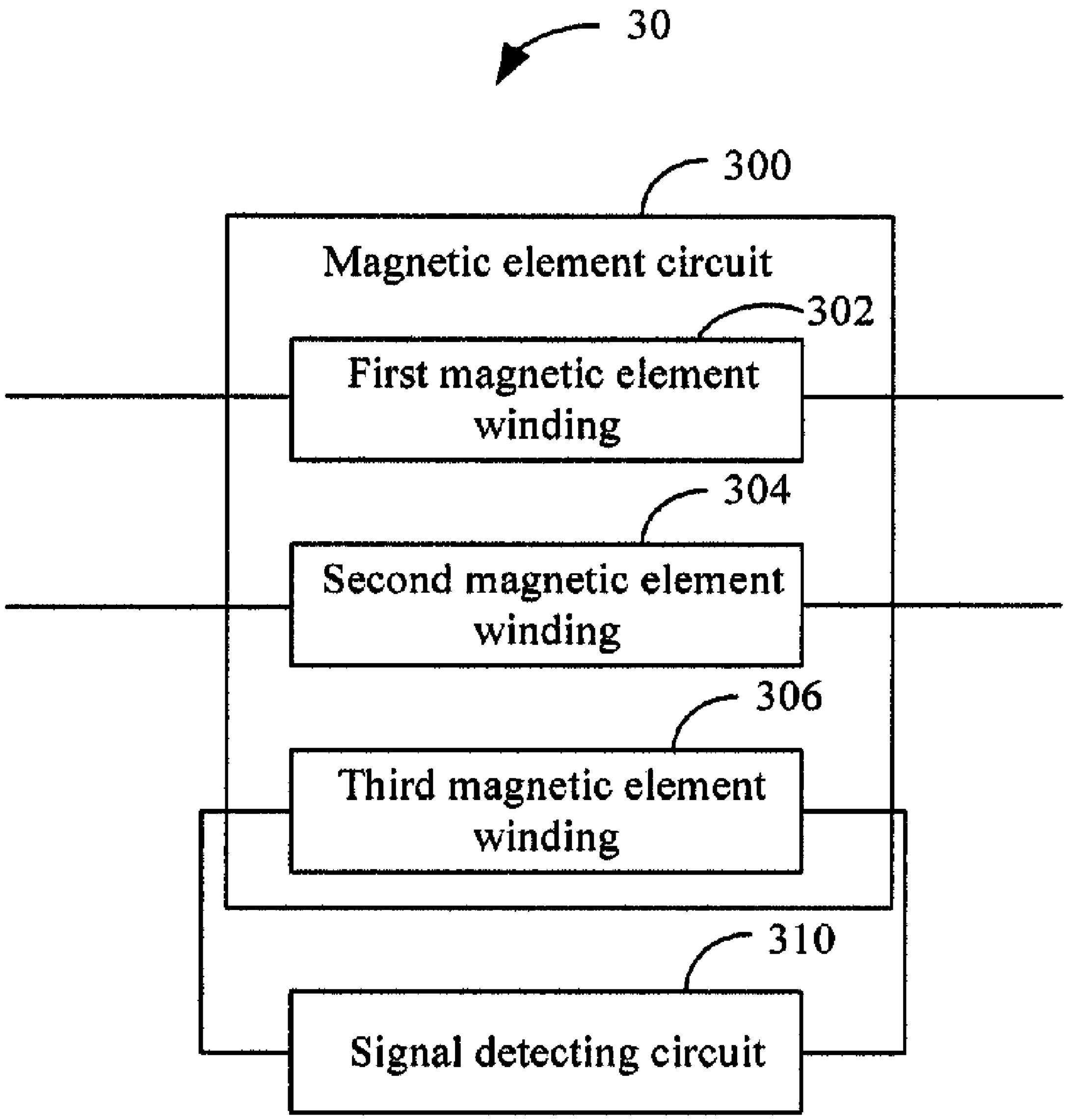
FIG. 2 shows a block diagram of the fault detecting circuit of FIG. 1.

FIG. 2 is a block diagram of the fault detecting circuit 30 in accordance with a preferred embodiment of the invention. In this preferred embodiment, the magnetic element circuit 300 includes a first magnetic element winding 302, a second magnetic element winding 304, and a third magnetic element winding 306. The first magnetic element winding 302 is connected to the first output part of the inverter circuit 20, and the second magnetic element winding 304 is connected to the second output part of the inverter circuit 20. The third magnetic element winding 306 is used for generating the induction signal if one or more of the plurality of outputs of the inverter circuit 20 is faulty. In this embodiment, the induction signal is a current signal.

In this embodiment, a winding ratio between the first magnetic element winding 302 and the second magnetic element winding 304 is reverse to a ratio between outputs of the first output part and outputs of the second output part. For example, if the inverter circuit 20 includes 14 outputs, the first output part includes 8 outputs, and the second output part includes 6 outputs, the reverse ratio between the first magnetic element winding 302 and the second magnetic element winding 304 is 3:4. If the inverter circuit 20 includes 16 outputs, the first output part includes 8 outputs, and the second output part includes 8 outputs, the reverse ratio between the first magnetic element winding 302 and the second magnetic element winding 304 is 1:1. Because the third magnetic element winding 306 may affect the intensity of the fault signal, the third magnetic element winding 306 is chosen according to the characteristics needed to provide the proper sensitivity to flux changes whereby the fault detecting circuit 30 can detect faults of the inverter circuit 20 without mistake.

Figure 3:
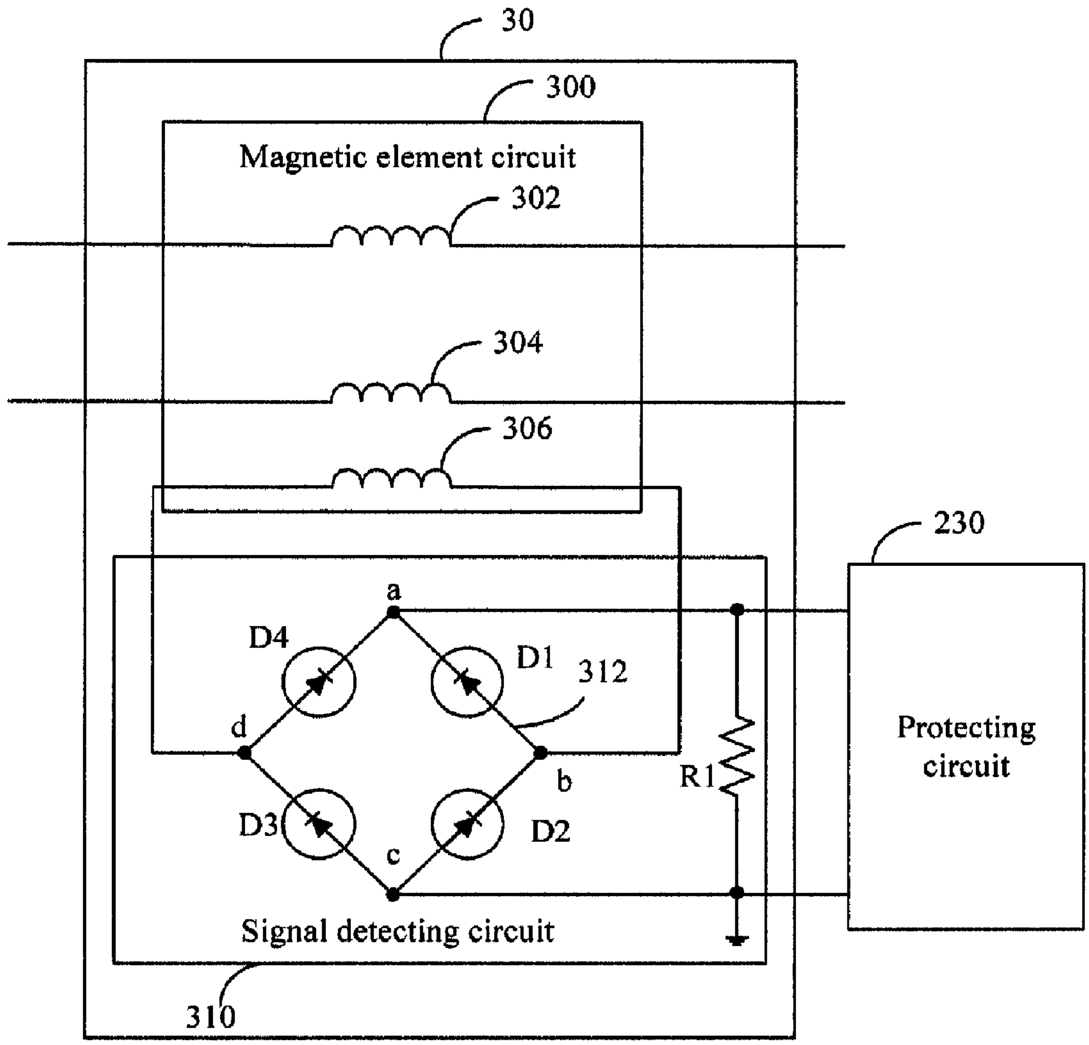
FIG. 3 shows a circuit diagram of the fault detecting circuit of FIG. 1.

FIG. 3 is a circuit diagram of the fault detecting circuit 30 in accordance with a preferred embodiment of the invention. The signal detecting circuit 310 includes a rectifier circuit 312 and a resistor R1. The rectifier circuit 312 includes four nodes a, b, c, and d. The nodes a and c are opposite each other, and the nodes b and c are opposite each other. The nodes b and d are respectively connected to the two ends of the third magnetic element winding 306. The resistor R1 is connected between the nodes a and c, and the node c is grounded. The two ends of the resistor R1 are also connected to the protecting circuit 230. The rectifier circuit 312 includes four diodes D1, D2, D3, and D4. The cathode of the diode D1 is connected to the node a, and the anode of the diode D1 is connected to the node b. The cathode of the diode D2 is connected to the node b, and the anode of the diode D2 is connected to the node c. The cathode of the diode D3 is connected to the node d, and the anode of the diode D3 is connected to node c. The cathode of the diode D4 is connected to the node a, and the anode of the diode D4 is connected to the node d. In alternative embodiments of the invention, the rectifier 312 includes other switching elements. In this preferred embodiments, the fault signal is a voltage signal.

When the inverter circuit 20 is normal, the plurality of outputs are normal, and the fluxes generated by the two output parts via the magnetic element circuit 300 counteract each other. Therefore, the third magnetic element circuit 306 doesn't generate signals, and the signal detecting circuit 310 doesn't generate a fault signal, that is, the voltage upon the resistor R1 is zero.

When one of the plurality of outputs of the inverter circuit 20 is faulty, the fluxes generated by the two output parts via the magnetic element circuit 300 do not counteract each other. Therefore, the third magnetic element winding 306 generates a current signal, the diodes D1 and D3 of the full-bridge rectifier 312 are turned on, or the diodes D2 and D4 are turned on, and the signal detecting circuit 310 generates a fault signal that is a voltage signal upon the resistor R1. Then the protecting circuit 230 takes actions according to the voltage signal upon the resistor R1, such as stopping all circuits from operating.

The fault detecting circuit 30 can detect whether one or more of the plurality of outputs of the inverter circuit 20 is faulty, subsequently the protecting circuit 230 takes actions to protect the inverter circuit 20. In addition, the fault detecting circuit 30 is simple, and cost thereof is low.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A system for driving a plurality of lamps, comprising:
- an inverter circuit comprising a plurality of outputs, wherein the plurality of outputs are divided into a first output part and a second output part; and
- a fault detecting circuit for detecting whether one or more of the plurality of outputs of the inverter circuit is faulty, comprising:
- a magnetic element circuit for generating an induction signal according to flux changes thereof when one or more of the plurality of outputs is faulty, the magnetic element circuit comprising:
  - a first magnetic element winding connected to the first output part; and
  - a second magnetic element winding connected to the second output part; and
  - a signal detecting circuit for generating a fault signal according to the induction signal;
- wherein a winding ratio between the first magnetic element winding and the second magnetic element winding is the inverse of a ratio between a number of outputs of the first output part and a number of outputs of the second output part.

2. The system of claim 1, wherein the magnetic element circuit further comprises:
- a third magnetic element winding for generating the induction signal when one or more of the plurality of outputs is faulty.

3. The system of claim 2, wherein the induction signal is a current signal.

4. The system of claim 2, wherein the signal detecting circuit comprises:
- a rectifier circuit comprising four nodes that are connected one by one,
- wherein two opposite nodes are respectively connected to two ends of the third magnetic element winding; and
- a resistor connected between the other two opposite nodes of the rectifier circuit.

5. The system of claim 4, wherein the rectifier circuit further comprises four diodes connected one by one, wherein each diode is connected to two of the nodes.

6. The system of claim 4, wherein the fault signal is a voltage signal.

7. The system of claim 4, wherein the resistor has one end thereof grounded.

8. A fault detecting circuit, for use in an inverter circuit comprising a plurality of outputs, and for detecting whether one or more of the plurality of outputs is faulty, the fault detecting circuit comprising:
- a magnetic element circuit; and
- a signal detecting circuit;
  - wherein the plurality of outputs of the inverter circuit are divided into a first output part and a second output part;
  - the magnetic element circuit is used for generating an induction signal according to flux changes of the magnetic element circuit when one of the plurality of outputs is faulty, the magnetic element circuit comprises:
    - a first magnetic element winding for connecting to the first output part of the inverter circuit; and
    - a second magnetic winding for connecting to the second output part of the inverter circuit;
    - wherein a winding ratio between the first magnetic element winding and the second magnetic element winding is the inverse of a ratio between a number of outputs of the first output part and a number of outputs of the second output part; and the signal detecting circuit is used for generating a fault signal according to the induction signal.

9. The fault detecting circuit of claim 8, wherein the magnetic element circuit further comprises:

a third magnetic element winding for generating the induction signal when one of the plurality of the outputs is faulty.

10. The fault detecting circuit of claim 9, wherein the induction signal is a current signal.

11. The fault detecting circuit of claim 9, wherein the signal detecting circuit comprises:

a rectifier circuit comprising four nodes, wherein two apposite nodes are respectively connected to two ends of the third magnetic element winding; and a resistor connected between the other two opposite nodes of the rectifier circuit.

12. The fault detecting circuit of claim 11, wherein the fault signal is a voltage signal.

13. The fault detecting circuit of claim 11, wherein the resistor has one end thereof grounded.

14. The fault detecting circuit of claim 11, wherein the rectifier circuit further comprises four diodes connected one by one, wherein each diode is connected between two of the nodes.

* * * * *